United States Patent
Louh

(10) Patent No.: US 7,989,149 B2
(45) Date of Patent: Aug. 2, 2011

(54) MOLD CORE AND METHOD FOR FABRICATING MOLD CORE

(75) Inventor: Sei-Ping Louh, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 161 days.

(21) Appl. No.: 12/541,664

(22) Filed: Aug. 14, 2009

(65) Prior Publication Data
US 2010/0163708 A1 Jul. 1, 2010

(30) Foreign Application Priority Data
Dec. 27, 2008 (CN) .......................... 2008 1 0306572

(51) Int. Cl.
*G03F 7/20* (2006.01)
*B29C 33/38* (2006.01)
(52) U.S. Cl. ........................................ 430/320; 430/323
(58) Field of Classification Search .................. None
See application file for complete search history.

(56) References Cited

U.S. PATENT DOCUMENTS

| | | | |
|---|---|---|---|
| 6,569,608 B2 * | 5/2003 | Tanaka et al. | 430/394 |
| 7,608,387 B1 * | 10/2009 | Louh | 430/296 |
| 2004/0229171 A1 * | 11/2004 | Chen | 430/320 |
| 2005/0031998 A1 * | 2/2005 | Chen et al. | 430/320 |

FOREIGN PATENT DOCUMENTS

JP 2-217233 A * 8/1990
JP 2005-243103 A * 9/2005

OTHER PUBLICATIONS

Computer-generated translation of JOP 2005-243103 (Sep. 2005).*
Abstract of KR 2005-032389 (Apr. 2005).*

* cited by examiner

*Primary Examiner* — John A. McPherson
(74) *Attorney, Agent, or Firm* — Raymond J. Chew

(57) ABSTRACT

An exemplary method for fabricating a mold core includes the following steps. First, an ultraviolet (UV) transmitting glass substrate is provided. Second, a photo resist layer is formed on the substrate. Third, the photo resist layer is exposed under a UV light and developed to form a plurality of spaced through holes therein. Fourth, the areas of the surface of the substrate under the through holes are etched to form a plurality of cavities. Fifth, each cavity is filled with a light-curable material, and the photo resist layer is removed. Sixth, the light-curable material is solidified to form a light-cured material block in each cavity. Lastly, the light-cured material block in each cavity is machined using an ultra-precision machine to form a molding surface of the light-cured material block. Thereby, the mold core with a plurality of the molding surfaces is obtained.

11 Claims, 7 Drawing Sheets

MOLD CORE AND METHOD FOR FABRICATING MOLD CORE

BACKGROUND

1. Technical Field

The present disclosure relates to mold cores and methods for fabricating mold cores, and particularly, to a mold core having a plurality of molding surfaces and a method for fabricating such mold core.

2. Description of Related Art

A typical method for fabricating a mold core includes the following steps: forming a light-curable material layer, such as polymethyl methacrylate (PMMA), on a substrate; press-molding the light-curable material layer using a metallic stamper; exposing the light-curable material layer to light and thereby solidifying the light-cured material layer to form a pattern; and removing the metallic stamper to obtain the mold core with a plurality of molding surfaces. Another typical method for fabricating the mold core involves using an ultra-precision machine to cut or grind the light-cured material layer to obtain the mold core with a plurality of molding surfaces.

With the above-described methods, when the light-cured material layer is formed on a surface of the substrate, because of an "edge bead" effect, it is difficult to form the layer with an even thickness. That is, a thickness of the edge of the layer is greater than that of the middle of the layer. Furthermore, in the press-molding process, the light-curable material layer typically has to contact and bear the weight of the entire stamper. Because the mechanical strength of the light-cured material layer is low, the plurality of molding surfaces are liable to be easily damaged.

Therefore, what is needed is a mold core with high mechanical strength and high precision, and a method for fabricating such mold core.

BRIEF DESCRIPTION OF THE DRAWINGS

Many aspects of the present mold core and method for fabricating a mold core can be better understood with reference to the following drawings. The components in the drawings are not necessarily to scale, the emphasis instead being placed upon clearly illustrating the principles of the present mold core and method for fabricating a mold core. Moreover, in the drawings, like reference numerals designate corresponding parts throughout the several views.

DETAILED DESCRIPTION

Reference will now be made to the drawings to describe in detail exemplary embodiments of the present mold core and present method for fabricating a mold core.

Figure 1:
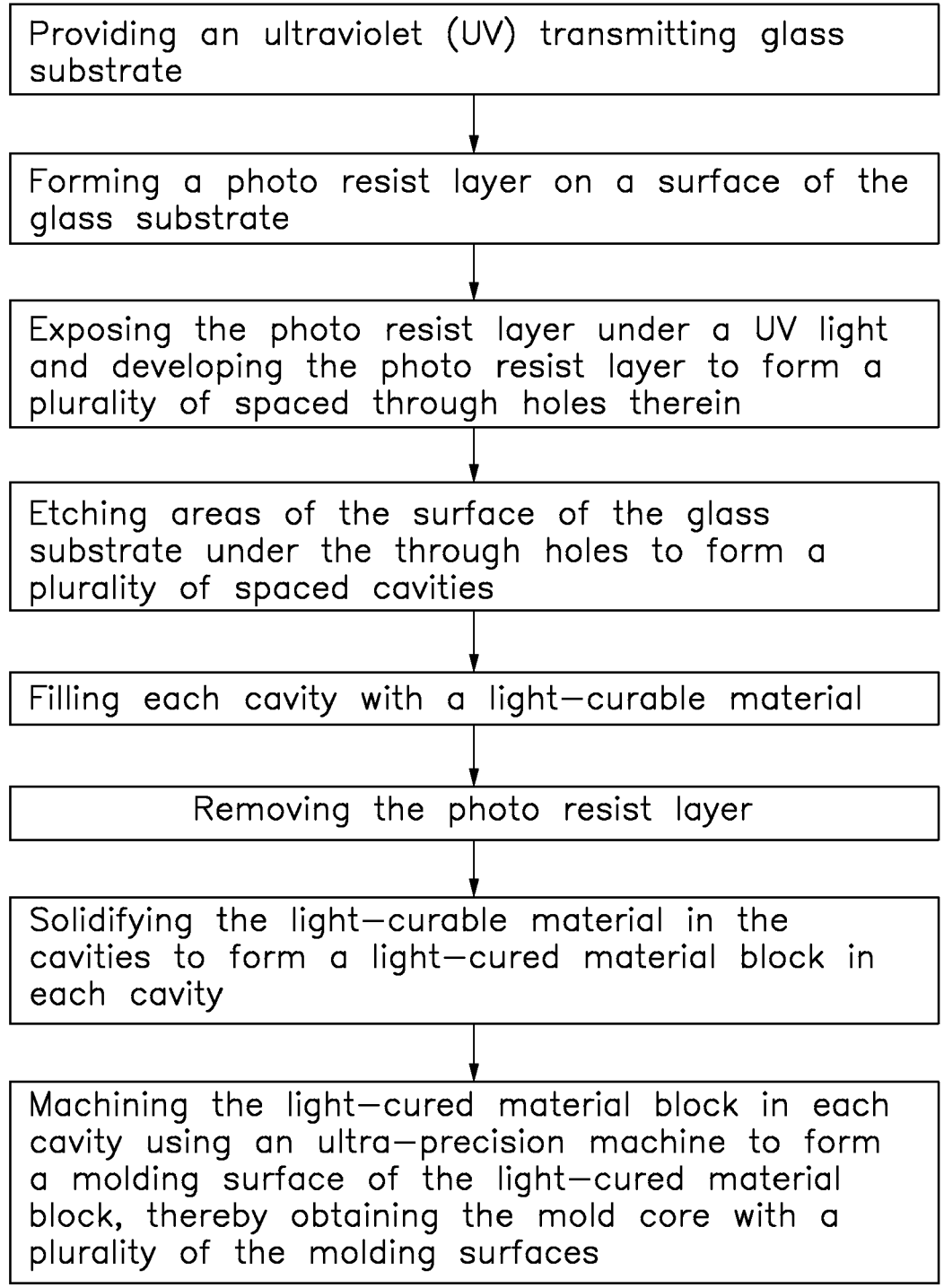
FIG. 1 is a flow chart of a method for fabricating a molding core, according to an exemplary embodiment.
Figure 6:
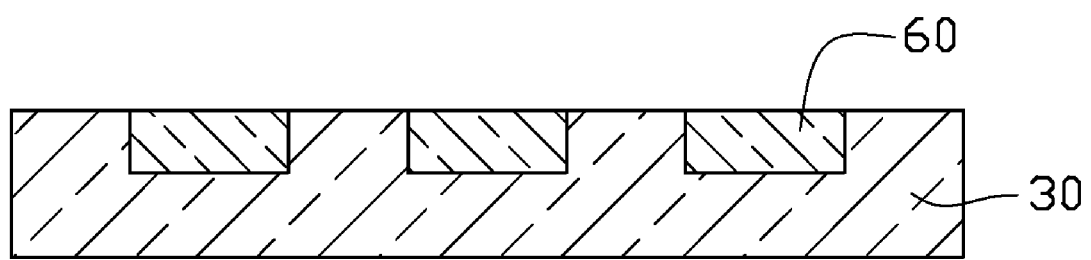
Figure 7:
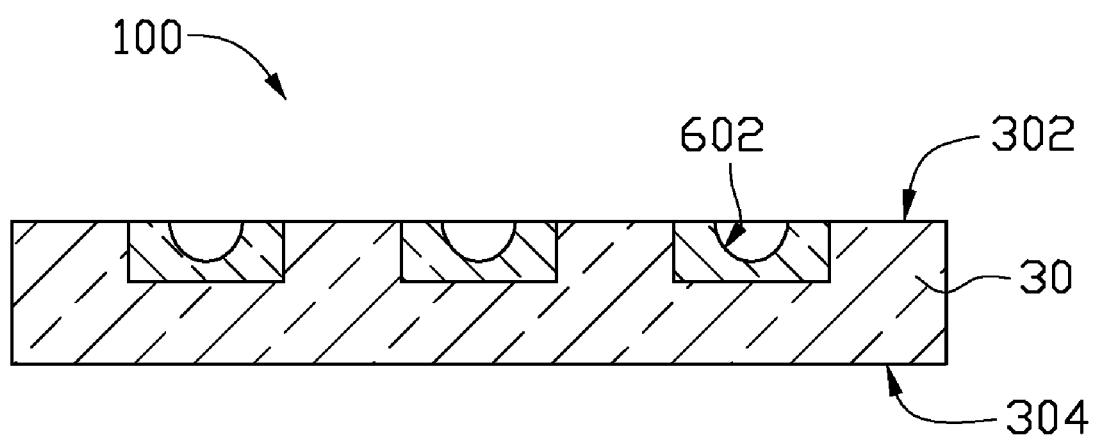

Referring to FIGS. 1 and 7, a method for fabricating a mold core 100 according to an exemplary embodiment is provided. Referring also to FIGS. 2-6, the method for fabricating the mold core 100 generally includes the steps of:

providing an ultraviolet (UV) transmitting glass substrate 30;

forming a photo resist layer 40 on a surface 302 of the glass substrate 30;

exposing the photo resist layer 40 under a UV light and developing the photo resist layer 40 to form a plurality of spaced through holes 402 on the photo resist layer 40;

etching areas of the surface 302 of the substrate 30 under the through holes 402 to form a plurality of spaced cavities 50 in the surface 302 of the glass substrate 30;

filling each cavity 50 with a light-curable material;

removing the photo resist layer 40;

solidifying the light-curable material in the cavities 50 to form a light-cured material block 60 in each cavity 50; and machining each light-cured material block 60 in each cavity 50 using an ultra-precision machine, to form a molding surface 602 of each light-cured material block 60, thereby obtaining the mold core 100 with a plurality of the molding surfaces 602.

Figure 2:
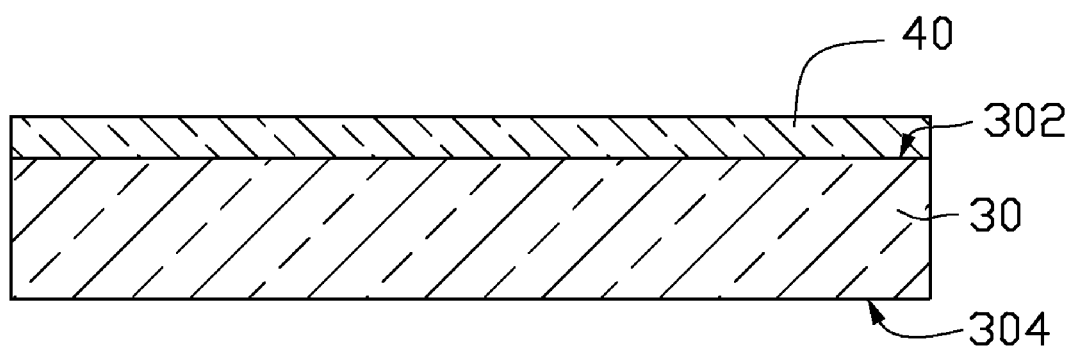
FIGS. 2 to 7 are schematic, cross-sectional views showing successive stages of fabricating a mold core according to the method of FIG. 1.

In detail, referring to FIG. 2, the glass substrate 30 is provided. The glass substrate 30 has a surface 302 and a surface 304 at opposite sides thereof. The glass substrate 30 is made of material which can transmit UV light. A transmittance of UV rays of the material is preferably greater than 95%. In the present embodiment, the glass substrate 30 is made of quartz glass.

A photo resist layer 40 is formed on the surface 302 of the glass substrate 30. The photo resist layer 40 may be made of epoxy resin, acrylic resin, polymethyl methacrylate, or poly-silicone resin. In the present embodiment, the photo resist 40 is made of polymethyl methacrylate, and is a positive photo resist. Any of various methods for forming the photo resist layer 40 on the glass substrate 30 can be used, such as spin coating, droplet dispensing, or spray coating. The thickness of the photo resist layer 40 may vary according to need.

Figure 3:
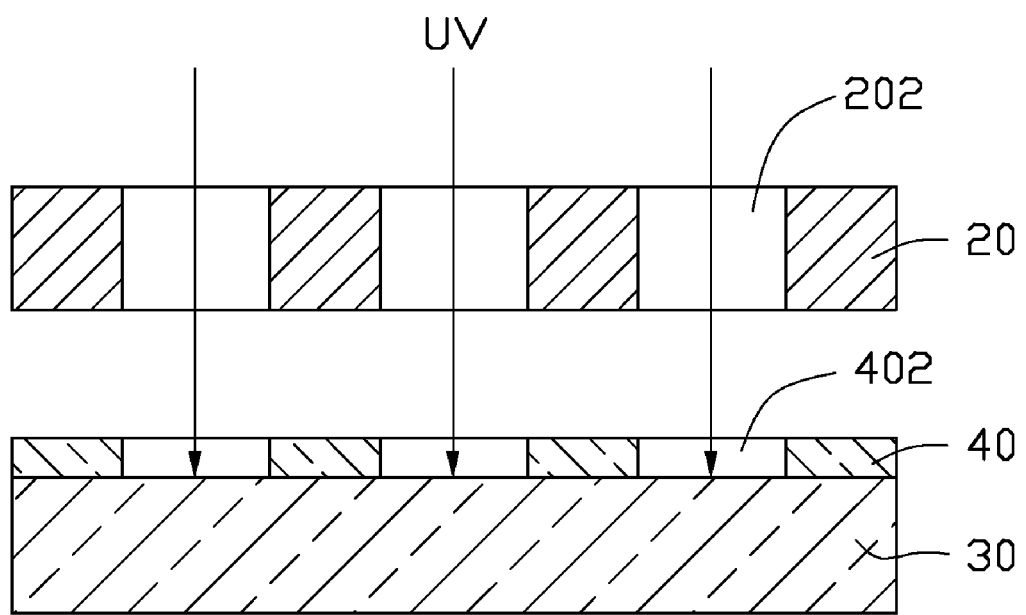

Referring to FIG. 3, a photo mask 20 having a number of spaced through holes 202 is positioned above the photo resist layer 40. Portions of the photo resist layer 40 are exposed by the through holes 202. The photo resist layer 40 is irradiated by a light source (not shown) above the photo mask 20, causing the polymer in the photo resist layer 40 to crosslink. In the present embodiment, the light source emits UV light. The UV light passes through the through holes 202 and reacts with the photo resist layer 40. In the present embodiment, the through holes 202 may be circular, elliptical or rectangular. The photo resist layer 40 is then developed, and a plurality of through holes 402 is thus formed in the photo resist layer 40. The through holes 402 have substantially the same shape and size as the through holes 202 of the photo mask 20.

Figure 4:
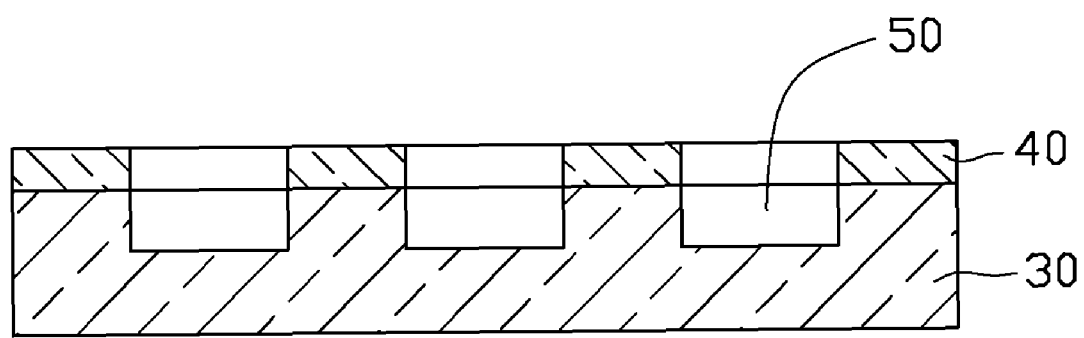

Referring to FIG. 4, portions of the glass substrate 30 not covered by the photo resist layer 40 are etched using a suitable etchant such as hydrofluoric acid, in order to form a plurality of block-shaped cavities 50.

Figure 5:
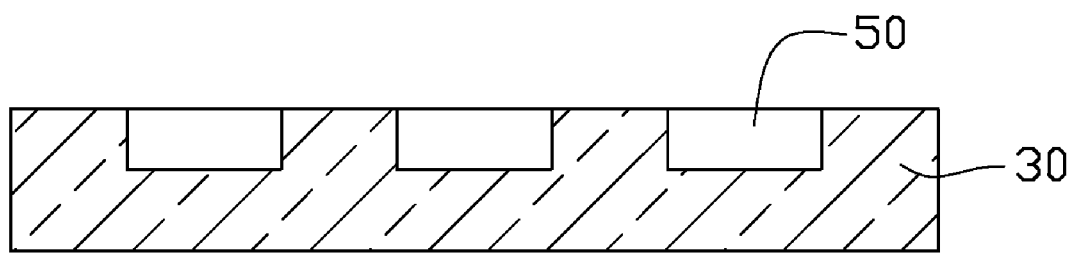

Referring to FIG. 5, the photo resist layer 40 is removed using a stripping solvent such as acetone. Thus, the glass substrate 30 with the block-shaped cavities 50 is obtained by using the above-described photo etching method.

Referring to FIG. 6, each cavity 50 is filled with a light-curable material, and an uncured precursor of a light-cured material block 60 is thereby formed in the cavity 50. It is understood that in alternative embodiments, the photo resist layer 40 can be removed after the cavities 50 are filled with the light-curable material. The uncured precursors of the light-cured material blocks 60 in the cavities 50 are irradiated by a light source (not shown), thereby causing the polymer in the light-curable material to crosslink and solidify and achieving the light-cured material blocks 60. The light-curable material may be polymethyl methacrylate (PMMA), polycarbonate (PC) or polyethylene terephthalate (PET), etc.

Referring to FIG. 7, the light-cured material block 60 in each cavity 50 is machined using an ultra-precision machine (not shown), and a molding surface 602 of the light-cured material block 60 is thereby formed. Thus, the mold core 100 with a plurality of molding surfaces 602 of the light-cured material blocks 60 is obtained. The method of machining can be a micro-milling method, which uses a milling cutter to mill each light-cured material block 60 to obtain the molding surface 602. The diameter of the milling cutter may be in a range of from 0.1 millimeter to 2 mm, so that the precision of the machining is very high. The molding surface 602 may be a concave spherical surface or a concave aspherical surface. In the present embodiment, the molding surfaces 602 are concave aspherical surfaces.

In the above-described method, the light-cured material is filled in the cavities 50 of the glass substrate 30. Since the interface area between the glass substrate 30 and the light-cured material of each light-cured material block 60 is relatively small, the "edge bead" effect is avoided and the thickness of the light-cured material block 60 can be more even. Furthermore, when the mold core 100 is used in a press-molding process, the glass substrate 30 can help support the stamper which is applied on the mold core 100 and therefore help bear the weight of the stamper. Thus, the light-cured material blocks 60 can avoid being damaged.

While the present invention has been described as having preferred and exemplary embodiments, the embodiments can be further modified within the spirit and scope of this disclosure. This application is therefore intended to cover any variations, uses, or adaptations of the embodiments using the general principles of the invention as claimed. Further, this application is intended to cover such departures from the present disclosure as come within known or customary practice in the art to which the invention pertains and which fall within the limits of the appended claims or equivalents thereof.

What is claimed is:

1. A method for fabricating a mold core, the method comprising:
providing an ultraviolet (UV) transmitting glass substrate;
forming a photo resist layer on a surface of the glass substrate;
exposing the photo resist layer under a UV light and developing the photo resist layer to form a plurality of spaced through holes therein;
etching areas of the surface of the glass substrate under the through holes to form a plurality of spaced cavities;
filling each cavity with a light-curable material;
removing the photo resist layer;
solidifying the light-curable material in the cavities to form a light-cured material block in each cavity; and
machining the light-cured material block in each cavity using an ultra-precision machine to form a molding surface of the light-cured material block, thereby obtaining the mold core with a plurality of the molding surfaces.

2. The method of claim 1, wherein the glass substrate is made of quartz glass.

3. The method of claim 1, wherein the machining comprises micro-milling.

4. The method of claim 3, wherein the micro-milling comprises using a milling cutter to mill the light-cured material block, and a diameter of the milling cutter is in a range of from 0.1 mm to 2 mm.

5. The method of claim 1, wherein each of the molding surfaces is a concave spherical surface.

6. The method of claim 1, wherein each of the molding surfaces is a concave aspherical surface.

7. The method of claim 1, wherein the photo resist layer is formed on the glass substrate using a method selected from the group consisting of spin coating, droplet dispensing, and spray coating.

8. The method of claim 1, wherein the light-curable material is selected from the group consisting of polymethyl methacrylate, polycarbonate and polyethylene terephthalate.

9. The method of claim 1, wherein a transmittance of ultraviolet rays of the glass substrate is greater than 95%.

10. The method of claim 1, wherein the photo resist layer is removed after each cavity is filled with a light-curable material.

11. The method of claim 1, wherein the photo resist layer is removed before each cavity is filled with a light-curable material.

* * * * *